United States Patent
Symanczyk

(10) Patent No.: US 7,257,014 B2
(45) Date of Patent: Aug. 14, 2007

(54) PMC MEMORY CIRCUIT AND METHOD FOR STORING A DATUM IN A PMC MEMORY CIRCUIT

(75) Inventor: Ralf Symanczyk, Tuntenhausen (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/337,940

(22) Filed: Jan. 23, 2006

(65) Prior Publication Data

US 2006/0176725 A1    Aug. 10, 2006

(30) Foreign Application Priority Data

Jan. 22, 2005    (DE) .................. 10 2005 003 025

(51) Int. Cl.
*G11C 11/00* (2006.01)
(52) U.S. Cl. ................... 365/148; 365/189.09
(58) Field of Classification Search ............. 365/148, 365/189.09
See application file for complete search history.

(56) References Cited

U.S. PATENT DOCUMENTS

2005/0127524 A1 * 6/2005 Sakamoto et al. .......... 257/774

FOREIGN PATENT DOCUMENTS

WO    02/082452    10/2002

* cited by examiner

*Primary Examiner*—Hoai V. Ho
(74) *Attorney, Agent, or Firm*—Dicke, Billig & Czaja, PLLC

(57) ABSTRACT

The invention relates to a PMC memory circuit comprising a PMC memory cell having a PMC component, the PMC component having a solid electrolyte with permanently introduced defects, so that the PMC component has a hysteresis with regard to its I-V characteristic curve with an upper and a lower current value branch, and a data retention unit, which, for storing a state to be stored, applies to the PMC component a center voltage or storage voltage at which the PMC component is operated, either in the upper current value branch of the hysteresis for the purpose of storing a first state or in the lower current value branch of said hysteresis for the purpose of storing a second state.

14 Claims, 2 Drawing Sheets

PMC MEMORY CIRCUIT AND METHOD FOR STORING A DATUM IN A PMC MEMORY CIRCUIT

CROSS-REFERENCE TO RELATED APPLICATIONS

This application claims foreign priority benefits under 35 U.S.C. §119 to co-pending German patent application number DE 10 2005 003 025.4-55, filed 22 Jan. 2005. This related patent application is herein incorporated by reference in its entirety.

BACKGROUND OF THE INVENTION

1. Field of the Invention

The invention relates to a PMC memory circuit having a PMC component, and to a method for storing a datum in a PMC memory circuit.

2. Description of the Related Art

Memory circuits having memory cells based on a solid electrolyte material are generally known as PMC (programmable metallization cell) or CBRAM (Conductive Bridging Random Access Memory). A PMC component used therefore has a solid electrolyte into which, depending on an electric field to be applied during writing, a low-resistance conductive path is formed or cancelled. As a result, a state of the PMC component can be set by setting a high-resistance or low-resistance state. The two resistance values can respectively be assigned a logic state, and a PMC memory circuit can thus be formed.

A PMC memory cell formed with a PMC component is written to by means of bipolar voltage pulses, a positive voltage at the anode effecting writing (formation of a conductive path) and a negative voltage at the anode effecting erasure (cancellation of the conductive path).

SUMMARY OF THE INVENTION

It is an object of the present invention to provide a PMC memory circuit which has a PMC component and which is based on a novel data storage principle for PMC components.

A first aspect of the present invention provides a PMC memory circuit having a PMC memory cell having a PMC component. The PMC component comprises a solid electrolyte with permanently introduced defects, so that the PMC component has a hysteresis with regard to its I-V characteristic curve with an upper and a lower current value branch. Provision is furthermore made of a data retention unit, which, for retaining a state to be stored, applies to the PMC component a storage voltage at which the PMC component is operated either in the upper current value branch of the hysteresis for the purpose of storing a first state or in the lower current value branch of said hysteresis for the purpose of storing a second state.

During electrical operation of the memory cell, the defects have the effect that the PMC component has a hysteresis in the current-voltage characteristic curve within a characteristic curve quadrant. This hysteresis is utilized according to the invention to store two states by virtue of a data retention unit being provided, which applies to the PMC component a storage voltage at which the component is operated either in the upper current value branch of the hysteresis for the purpose of storing a first state or in the lower current value branch of said hysteresis for the purpose of storing a second state.

The PMC memory circuit according to the invention realizes a novel concept for constructing a memory circuit on the basis of a PMC component. Instead of the concept described in the introduction, namely of storing the data to be stored by forming or removing a metallic path within the PMC component, instead the PMC component is provided with permanently introduced defects in the solid electrolyte. The storage concept is based according to the invention on a local shifting of ionic portions in the solid electrolyte, in particular in the region of said defects under the influence of electric fields. One advantage of the use of such a memory arrangement consists in the fact that the higher electric currents or quantities of charge required for forming and removing a metallic path are not required since a state is stored merely by moving the operating point of the PMC component on the hysteresis characteristic curve between the upper and lower current value branch. A further advantage is afforded by the fact that the hysteresis is restricted to a characteristic curve quadrant and consequently, in contrast to the already known concept, enables a unipolar electrical operation of the memory cell.

A writing unit may be provided, which writes the first state to the PMC memory cell by virtue of the writing unit applying to the PMC component a first voltage greater than or equal to a first threshold voltage, and which writes the second state to the PMC memory cell by virtue of the writing unit applying to the PMC component a second voltage less than or equal to a second threshold voltage. The data retention unit is configured so as, after the application of the first or second voltage, subsequently to change said voltage at the PMC component and also the storage potential, so that the written state is stored. The writing unit makes it possible to utilize the hysteresis of the PMC component and to set the state to be stored by moving the operating point on the hysteresis characteristic curve.

A read-out unit may furthermore be provided, which has an evaluation circuit in order, when the storage voltage is present, depending on the current flowing through the PMC component, to detect the first or the second state and to output a datum depending on the detected state.

A further aspect of the present invention provides a method for storing a datum in a PMC memory circuit comprising a PMC memory cell having a PMC component, the PMC component having a solid electrolyte with permanently introduced defects, so that the PMC component has a hysteresis with an upper and a lower current value branch with regard to its I-V characteristic curve. A storage voltage is applied for the purpose of retaining a state to be stored in the PMC memory cell, at which storage voltage the PMC component is operated either in the upper current value branch of the hysteresis in accordance with the first state or in the lower current value branch of the hysteresis in accordance with the second state.

The storage method according to the invention has the advantage of using a PMC memory cell for storing a datum without the inner structure of the PMC component having to be changed by a programming step that changes the material composition, that is to say that it is not necessary to form or cancel any metallic paths in order to store the datum. Instead, the datum can be stored by applying a defined storage voltage that keeps the PMC component in a predetermined operating state to which the stored datum can be assigned.

A first state is written to the PMC memory cell by virtue of a first voltage, which is greater than or equal to a first threshold voltage, being applied to the PMC component, a second state being written to the PMC memory cell by virtue of a second voltage, which is less than or equal to a second threshold voltage, being applied to the PMC component, in which case, after the application of the first or second voltage, the voltage at the PMC component is subsequently changed to the storage voltage in order to retain the written state.

It may furthermore be provided that, for the purpose of reading from the PMC memory cell, when the storage voltage is present, depending on the current flowing through the PMC component, a first or a second state is detected, a datum being output depending on the detected state of the PMC component.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
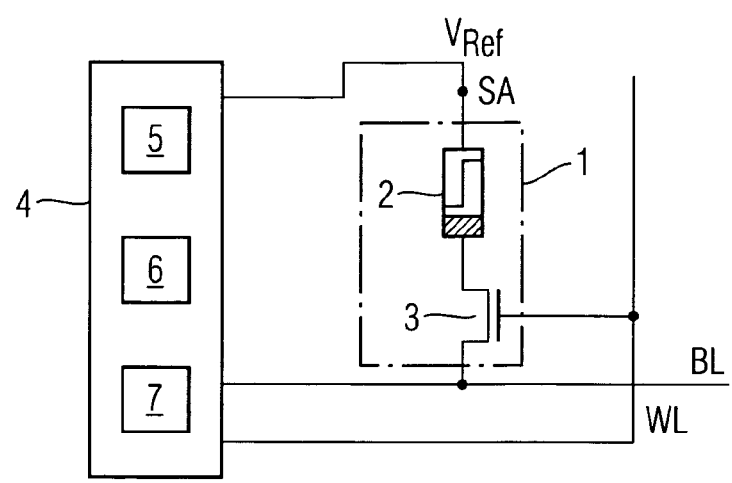
FIG. 1 shows a block diagram of a PMC memory circuit according to the invention in accordance with a preferred embodiment.

FIG. 1 shows a PMC memory circuit according to the invention in accordance with a preferred embodiment. The PMC memory circuit has a PMC memory cell 1 comprising a PMC component 2 and a switching transistor 3. The PMC component 2 and the switching transistor 3 are connected in series between a voltage terminal SA and a bit line BL, the cathode of the PMC component being connected to the voltage terminal, the anode of the PMC component 2 being connected to a first terminal of the switching transistor 3 and a second terminal of the switching transistor 3 being connected to the bit line BL. A control terminal of the switching transistor 3 can be driven via a word line WL.

The voltage terminal, the bit line and the word line WL are connected to a control unit 4, with which the PMC memory cell 1 can be operated as memory circuit. For this purpose, the control unit 4 has a data retention unit 5, a writing circuit 6 and a read-out unit 7 in order to read from and write to the PMC memory cell 1 and to retain the stored datum.

The PMC component 2 is essentially formed as a conventional PMC component with a solid electrolyte. The PMC component usually has an anode with an anode material Ag or Cu and a solid electrolyte material, such as, e.g., GeSe, GeS, AgSe, etc. Depending on the electric field applied across the solid electrolyte, metal anions can migrate from the anode into the solid electrolyte, or the anions forced from the solid electrolyte by the electric field can accumulate at the anode. However, in comparison with the conventional PMC components that are usually used, the PMC component 2 is pretreated in a suitable manner in order to attain an I-V characteristic curve with a pronounced hysteresis behavior and NDR (i.e., negative differential resistance) characteristic curve regions. The PMC component is pretreated, for example, by applying voltage and/or current pulses having a positive potential to the anode terminal of the PMC component. This gives rise to defects which, depending on the intensity and duration of the pulses, are more or less pronounced and are permanently durable (that is to say, essentially cannot be cancelled by further voltage and/or current pulses) in the matrix of the solid electrolyte material. As an alternative, the desired conditioning of the PMC component may be effected by thermal pretreatment (high-temperature storing). In this case, too, defects arise in the matrix as a result of the penetration of metal clusters from the anode material. The defects filled with metal clusters change the electrical resistance of the component from a high-resistance initial state to a low-resistance basic state. Given a sufficiently high electric field strength with negative polarity at the anode, the mobile ionic components are shifted from the defects in the direction of the electrodes. The electrical resistance of the component then rises again.

In the voltageless state, the defects are again filled with metal clusters. This results in an I-V characteristic curve with hysteresis and a negative differential resistance characteristic in a voltage range of 0 to approx 500 mV. Depending on the way in which the pretreatment of the PMC component is carried out, that is to say, for example, depending on the intensity and duration of the voltage and/or current pulses, the characteristic curve branches of the I-V hysteresis characteristic curve can be shifted over a wide range, and the current values for each logic state can thus vary over a plurality of powers of ten.

Figure 2:
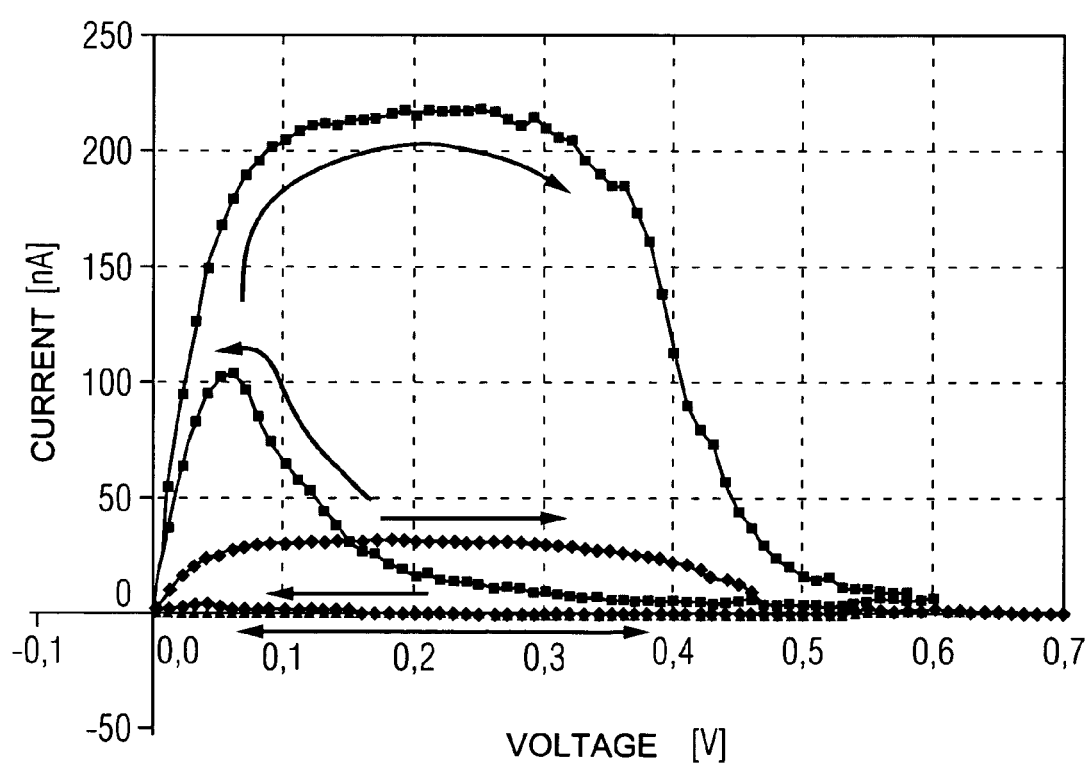
FIG. 2 shows two I-V characteristic curves for a PMC component with permanently introduced defects having been impressed.

FIG. 2 illustrates two I-V characteristic curves of such a modified PMC component for positive polarity at the cathode of the element. The illustration reveals two hysteresis characteristic curves for two different PMC components that were pretreated beforehand under different stress conditions. The first hysteresis curve, which is marked by rhomboidal symbols, corresponds to the I-V characteristic curve of a PMC component which was pretreated with a lower stress than the second hysteresis curve, identified by the squares. It is evident that the higher the stress during the pretreatment of the PMC component, the more pronounced the hysteresis of the I-V characteristic curve. The stress conditions correspond to the current amplitude and the pulse duration or the number thereof or the absolute temperature and duration during thermal conditioning with which the PMC component is pretreated. The hysteresis of the I-V characteristic curve forms between a first, upper threshold voltage and a second, lower threshold voltage, that is to say, at the respective branching points of the characteristic curve branches. In the measurement curves shown, the threshold voltages correspond to approximately 0.45 V and 0 V for the PMC component described by the first hysteresis curve and 0.55 V and 0.01 V for the PMC component described by the second hysteresis curve.

The data retention unit 5 contained in the control unit 4 serves for retaining a datum previously written to the PMC memory cell 1 by virtue of a storage voltage being applied to the PMC component 2, which storage voltage holds the operating point of the PMC component 2 at the upper or lower current value branch of the I-V characteristic curve of the PMC component 2 depending on the state to be stored. The writing unit 6 serves for applying to the PMC component 2 a first voltage, which is greater than or equal to the first threshold voltage, or a second voltage, which is less than or equal to the second threshold voltage, depending on whether an operating point on the upper or lower current value branch of the hysteresis characteristic curve is to be assumed in order to retain the state to be stored by means of a subsequent application of the storage voltage. When a voltage which is greater than the first threshold voltage is applied, an operating point on the lower current value branch is selected when the storage voltage is subsequently applied, and, when a voltage which is less than the lower second threshold voltage is applied, an operating point on the upper current value branch is selected when the storage voltage is subsequently applied. The read-out circuit 7 essentially measures the current flowing through the PMC component 2 when the storage voltage is applied.

Figure 3:
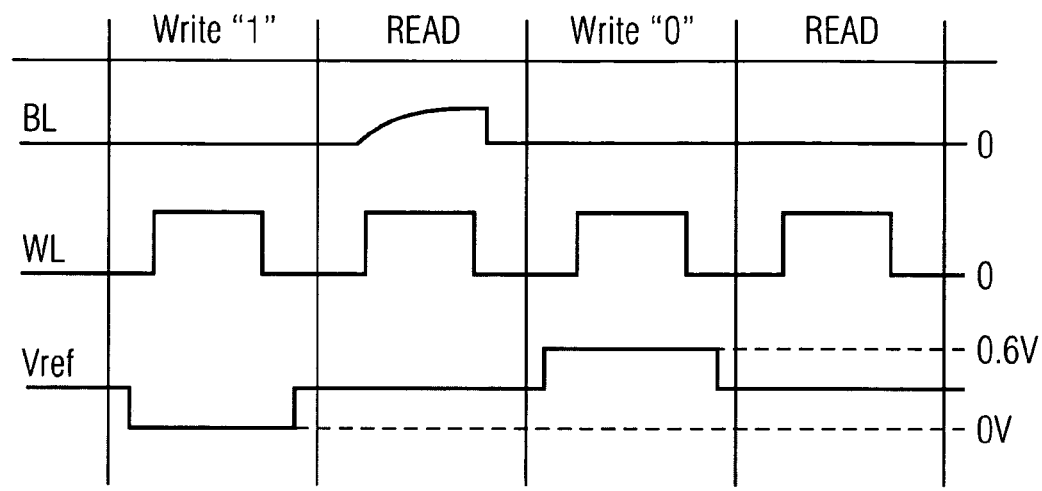
FIG. 3 shows a signal timing diagram regarding the driving of the PMC memory cell of the PMC memory circuit from FIG. 1 for writing and reading a datum.

The writing to and reading from the PMC memory cell 1 are described using the signal timing diagram of FIG. 3, where the profile of the signals on the word line WL, the bit line BL and at the voltage terminal SA is specified. For the purpose of writing a state which corresponds to a logic "1", which in the example shown corresponds to an operating point on the upper current value branch, firstly a voltage is applied to the cathode of the PMC component 2 and the word line is activated, so that the switching transistor 3 turns on and a voltage which is less than or equal to the second, lower threshold voltage is dropped between the voltage terminal SA and the bit line BL. Upon subsequent deactivation of the word line and setting of a storage voltage via the voltage terminal, a subthreshold voltage current flows through the turned-off switching transistor 3, which current suffices to cause the storage voltage to be dropped across the PMC component 2, which holds the PMC component 2 at an operating point on the upper current value branch of the hysteresis characteristic curve.

For the purpose of reading out the stored logic "1" written previously, the word line is again activated, so that the switching transistor 3 is turned on, while the storage voltage is present at the voltage terminal SA. The bit line BL is charged since the operating point of the PMC component 2 is in the upper current value branch, so that a current flows which charges the capacitance of the bit line. The potential change on the bit line BL can be detected by the read-out unit 7 and be assigned to the logic state "1".

Next, as shown in FIG. 3, a logic "0" is to be written to the PMC memory cell 1. This is carried out by virtue of a specific potential being applied to the voltage terminal SA by the control unit 4, in particular by the writing unit 6, and the word line WL subsequently being activated in order to turn on the switching transistor 3. The specific potential is chosen such that a voltage greater than or equal to the first, high threshold voltage is present across the PMC component 2, so that an operating point on the lower current value branch can be assumed when the voltage present at the PMC component 2 decreases. Here, too, the subthreshold voltage current of the switching transistor 3 suffices to hold the operating point on the lower current value branch even when the switching transistor 3 is turned off.

During the subsequently illustrated read-out operation, when the word line WL is activated with a storage voltage present at the voltage terminal, only a very small current flows through the PMC component 2 in the case of a stored logic "0". Therefore, the bit line is not charged or is only charged during a considerable time duration, so that essentially no potential change can be detected on the bit line. The occurrence or the non-occurrence of a voltage change on the bit line BL is assigned to the corresponding logic states and made available by the read-out unit 7.

Figure 4:
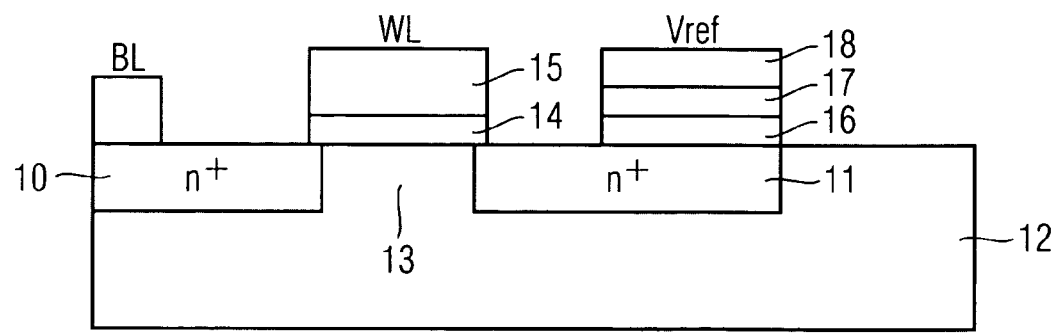
FIG. 4 shows a cross-sectional view of a PMC memory cell such as can be used for example in the embodiment of FIG. 1.

FIG. 4 shows an embodiment of the construction of a PMC memory cell such as can be used in the embodiment of FIG. 3. FIG. 4 shows a cross-sectional illustration of a field effect transistor structure having a source region 10 and a drain region 11, which are arranged in a substrate 12, source and drain regions 10, 11 having a different conductivity type from that of the substrate 12. In FIG. 4, by way of example, the $n^+$ type is specified for the regions 10, 11. Region 12 then has the p type. The conductivity types may also be interchanged between the regions 10, 11, and 12. Situated at a distance between source and drain regions 10, 11 is a channel region 13, above which is arranged a gate oxide 14 provided with a word line structure 15. A conductive channel is or is not formed between the source and drain regions 10, 11 depending on the potential at the word line structure. The drain region 11 is provided with a PMC element having an anode layer 16, which may contain copper or silver, by way of example. There is applied on the anode layer 16 a layer made of a suitable solid electrolyte 17, on which is situated in turn a cathode layer 18 corresponding to the voltage terminal SA.

While the foregoing is directed to embodiments of the present invention, other and further embodiments of the invention may be devised without departing from the basic scope thereof, and the scope thereof is determined by the claims that follow.

What is claimed is:

1. A programmable metallization cell (PMC) memory circuit, comprising:
   a PMC memory cell having a PMC component comprising a solid electrolyte with permanently introduced defects, the cell having a current-voltage (I-V) characteristic curve having a hysterisis with an upper current value branch and a lower current value branch, wherein the PMC component is operated in the lower current value branch of the hysteresis for storing a first state, and wherein the PMC component is operated in the higher current value branch of the hysteresis for storing a second state; and
   a data retention unit for retaining a respective state stored in the PMC memory cell, wherein the data retention unit is configured to selectively apply to the PMC component a storage voltage at which the PMC component is operated.

2. The PMC memory circuit of claim 1, further comprising:
   a writing unit configured to:
      write the first state to the PMC memory cell by applying to the PMC component a first voltage at least equal to a first threshold voltage,
      write the second state to the PMC memory cell by applying to the PMC component a second voltage which is less than or equal to a second threshold voltage, and
   wherein, after the application of respective one of the first voltage and the second voltage, the storage voltage is applied to the PMC component to store the written state.

3. The PMC memory circuit of claim 2, further comprising:
   a read-out unit comprising an evaluation circuit configured to:
      apply a read voltage having a value between the first and second voltage;
      measure a current flowing through the PMC component;

assign one of the first state and the second state to the measured current value; and output a datum depending on the assigned state.

4. The PMC memory circuit of claim 3, further comprising:

a switch connected between the PMC component and a bit line, the switch selectively activated by a word line signal.

5. The PMC memory circuit of claim 4, further comprising:

a control unit comprising the data retention unit, the writing unit and the read-out unit, the control unit connected to the PMC component, the bit line and the word line.

6. A method for storing a datum, comprising providing PCM memory circuit having a PMC memory cell having a PMC component, the PMC component having a solid electrolyte with permanently introduced defects and having a hysteresis with an upper current value branch and a lower current value branch with regard to its I-V characteristic curve; and applying a center voltage for storing a state to be stored in the PMC memory cell, wherein the PMC component is operated in the lower current value branch of the hysteresis for storing a first state, and wherein the PMC component is operated in the higher current value branch of the hysteresis for storing a second state.

7. The method of claim 6, further comprising, prior to applying the center voltage, writing one of the first state and the second state to the PMC memory cell, wherein the first state is written to the PMC memory cell by applying to the PMC component a first voltage at least equal to a first threshold voltage, and wherein the second state is written to the PMC memory cell by applying to the PMC component a second voltage which is less than or equal to a second threshold voltage, wherein the center voltage has a value between the first and second voltages and wherein a voltage applied to the PMC component is subsequently changed to the center voltage.

8. The method of claim 7, further comprising:

reading a datum from the PMC memory cell when the center voltage is present, wherein a current flowing through the PMC component is measured, the measured current being assigned one of the first state and the second state, the datum being output depending on the assigned state of the PMC component.

9. The method of claim 8, wherein the PMC memory cell further comprises a switching transistor connected between the PMC component and a bit line, and the method further comprising:

selectively activating a word line connected to selectively activate the switching transistor for performing respective writing and reading operations.

10. A programmable metallization cell (PMC) memory circuit, comprising:

a PMC memory cell comprising:

a PMC element comprising a solid electrolyte with permanently introduced defects which exhibits a hysteresis with regard to its I-V characteristic curve with an upper current value branch and a lower current value branch, wherein a first state is defined by the PMC element operating in the lower current value branch of the hysteresis, and wherein a second state is defined by the PMC element operating in the higher current value branch of the hysteresis; and a data retention unit configured to apply to the PMC element a storage voltage at which the PMC element is operated.

11. The PMC memory circuit of claim 10, wherein the PMC memory cell further comprises:

a switching transistor connected between the PMC element and a bit line, the switching transistor having a control terminal connected to a word line, wherein, when the switching transistor is activated, the PMV element is connected to the bit line via the switching transistor.

12. The PMC memory circuit of claim 11, further comprising:

a writing unit configured to:

write the first state to the PMC memory cell by applying to the PMC element a first voltage at least equal to a first threshold voltage, whereby the PMC element is operated in the lower current value branch of the hysteresis;

write the second state to the PMC memory cell by applying to the PMC element a second voltage which is less than or equal to a second threshold voltage, whereby the PMC element is operated in the higher current value branch of the hysteresis, and wherein, after the application of respective one of the first voltage and the second voltage, the storage voltage is applied to the PMC element to store the respective state.

13. The PMC memory circuit of claim 12, further comprising:

a read-out unit comprising an evaluation circuit configured to:

apply a read voltage having a value between the first and second voltage;

measure a current flowing through the PMC component;

assign one of the first state and the second state to the measured current value; and output a datum depending on the assigned state.

14. The PMC memory circuit of claim 13, further comprising:

a control unit comprising the data retention unit, the writing unit and the read-out unit, the control unit connected to selectively activate the word line and apply the respective voltage to the PMC element from the data retention unit, the writing unit and the read-out unit.

* * * * *